(12) United States Patent
Rossberg

(10) Patent No.: US 11,736,075 B2
(45) Date of Patent: Aug. 22, 2023

(54) HIGH ACCURACY OUTPUT VOLTAGE DOMAIN OPERATION SWITCHING IN AN OPERATIONAL AMPLIFIER

(71) Applicant: MACOM Technology Solutions Holdings, Inc., Lowell, MA (US)

(72) Inventor: Andre Rossberg, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 148 days.

(21) Appl. No.: 17/220,086

(22) Filed: Apr. 1, 2021

(65) Prior Publication Data

US 2022/0321068 A1 Oct. 6, 2022

(51) Int. Cl.
*H03F 1/02* (2006.01)
*H03F 3/217* (2006.01)
*H03M 1/70* (2006.01)

(52) U.S. Cl.
CPC ......... *H03F 3/2175* (2013.01); *H03F 1/0261* (2013.01); *H03M 1/70* (2013.01)

(58) Field of Classification Search
CPC ....... H03F 3/2175; H03F 1/0261; H03M 1/70
USPC ................................................. 330/51, 9, 69
See application file for complete search history.

(56) References Cited

U.S. PATENT DOCUMENTS

| 4,641,105 | A | * | 2/1987 | Albaugh | ............. H03F 3/45968 330/9 |
| 7,154,308 | B2 | * | 12/2006 | Ho | ......................... H03G 3/348 327/131 |
| 8,411,707 | B2 | | 4/2013 | Molina et al. | |
| 9,431,379 | B2 | | 8/2016 | Kerber et al. | |
| 9,712,120 | B2 | | 7/2017 | Nobbe et al. | |
| 9,774,320 | B2 | | 9/2017 | Rossberg et al. | |
| 9,825,545 | B2 | | 11/2017 | Chen et al. | |
| 9,958,890 | B2 | | 5/2018 | Zanchi | |
| 10,326,411 | B2 | | 6/2019 | Lu et al. | |
| 10,727,854 | B1 | | 7/2020 | Greshishchev et al. | |
| 10,756,675 | B2 | | 8/2020 | Leipold et al. | |
| 10,897,233 | B2 | | 1/2021 | Travis | |
| 2011/0241771 | A1 | * | 10/2011 | Nielsen | ............... H03F 3/45475 330/75 |

* cited by examiner

*Primary Examiner* — Hafizur Rahman
*Assistant Examiner* — Khiem D Nguyen
(74) *Attorney, Agent, or Firm* — Amin, Turocy & Watson, LLP

(57) ABSTRACT

An amplifier circuit is capable of switching between a unipolar output voltage domain and a bipolar output voltage domain. The amplifier circuit comprises an operational amplifier with a feedback circuit that is configurable using switches. By controlling the switches, the amplifier's feedback circuit can switched between two different arrangements having a positive and a negative signal gain, respectively. The amplifier circuit is designed such that the noise gain is the same in both operating modes, allowing a single noise compensation approach to be used for both operating modes. Since configurability of the circuit is achieved using static switches, the amplifier circuit maintains high accuracy and experiences no appreciable impact on power consumption as a result of implementing the switching.

23 Claims, 8 Drawing Sheets

HIGH ACCURACY OUTPUT VOLTAGE DOMAIN OPERATION SWITCHING IN AN OPERATIONAL AMPLIFIER

TECHNICAL FIELD

The subject disclosure relates generally to semiconductor design and, in particular, to amplifier circuits.

BACKGROUND

Many electrical and electronic systems, such as integrated circuits (ICs), system-on-chip (SoC) architectures, very large scale integration (VLSI) systems, and printed circuit boards, include amplifier circuits designed to provide a supply voltage or bias voltage to other system components or sub-systems. For example, digital-to-analog converter (DAC) circuits are often used to provide a bias voltage to radio frequency (RF) amplifiers.

Some amplifier circuits are designed to operate in a unipolar domain whereby the output voltage can vary between zero and a positive voltage value, while others are designed to operate in a bipolar domain whereby the amplifier is capable of outputting either a positive or negative output voltage. An amplifier circuit for a given application must be selected such that the output voltage domain satisfies the requirements of the system in which the amplifier operates. For example, some RF amplifiers require a positive bias voltage while others require a negative bias voltage. Since the output voltage domain is typically a fixed characteristic of the amplifier circuit design, a given amplifier circuit designed to operate in a particular output voltage domain—either unipolar or bipolar—is limited to use in applications that require a supply or bias voltage that operates in that domain.

The above-described description is merely intended to provide a contextual overview of current integrated circuits and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, an amplifier circuit is provided, comprising an operational amplifier; a first switch that connects a first input of the operational amplifier to ground; a first resistor in parallel with the first switch; a second switch that connects an output of an input signal source to the first input of the operational amplifier; a third switch that connects the output of the input signal source to a second input of the operational amplifier; a second resistor connected between the second input of the operational amplifier and ground; and a feedback resistor connected between an output of the operational amplifier and the second input of the operational amplifier, wherein in response to an instruction to operate in a first mode, the first switch and the third switch close and the second switch opens, and in response to an instruction to operate in a second mode, the first switch and the third switch open and the second switch closes.

Also, according to one or more embodiments, an amplifier circuit is provided, comprising, an operational amplifier having a first input connected to ground via a first resistor, a second input connected to ground via a second resistor, and an output connected to the second input via a feedback resistor, a first switch configured to short the first input to ground while closed; a second switch configured to connect an output of an input signal source to the first input while closed; and a third switch configured to connect the output of the input signal source to the second input while closed, wherein in response to an instruction to operate in a first voltage domain, the first switch and the third switch close and the second switch opens, and in response to an instruction to operate in a second voltage domain, the first switch and the third switch open and the second switch closes.

Also, according to one or more embodiments, a method is provided, comprising, in response to an instruction to operate the amplifier circuit in a first mode: closing a first switch that shorts a first input of an operational amplifier to ground; opening a second switch causing an output of an input signal source to disconnect from the first input; and closing a third switch that connects the output of the input signal source to a second input of the operational amplifier; and in response to a second instruction to operate the amplifier circuit in a second mode: opening the first switch causing the first input to connect to ground through a first resistor; closing the second switch causing the output of the input signal source to connect to the first input of the operational amplifier; and opening the third switch causing the output of the input signal source to disconnect from the second input of the operational amplifier, wherein the second input of the operational amplifier is connected to ground through a second resistor, and a feedback resistor is connected between an output of the operational amplifier and the second input of the operational amplifier.

DETAILED DESCRIPTION

Figure 1:
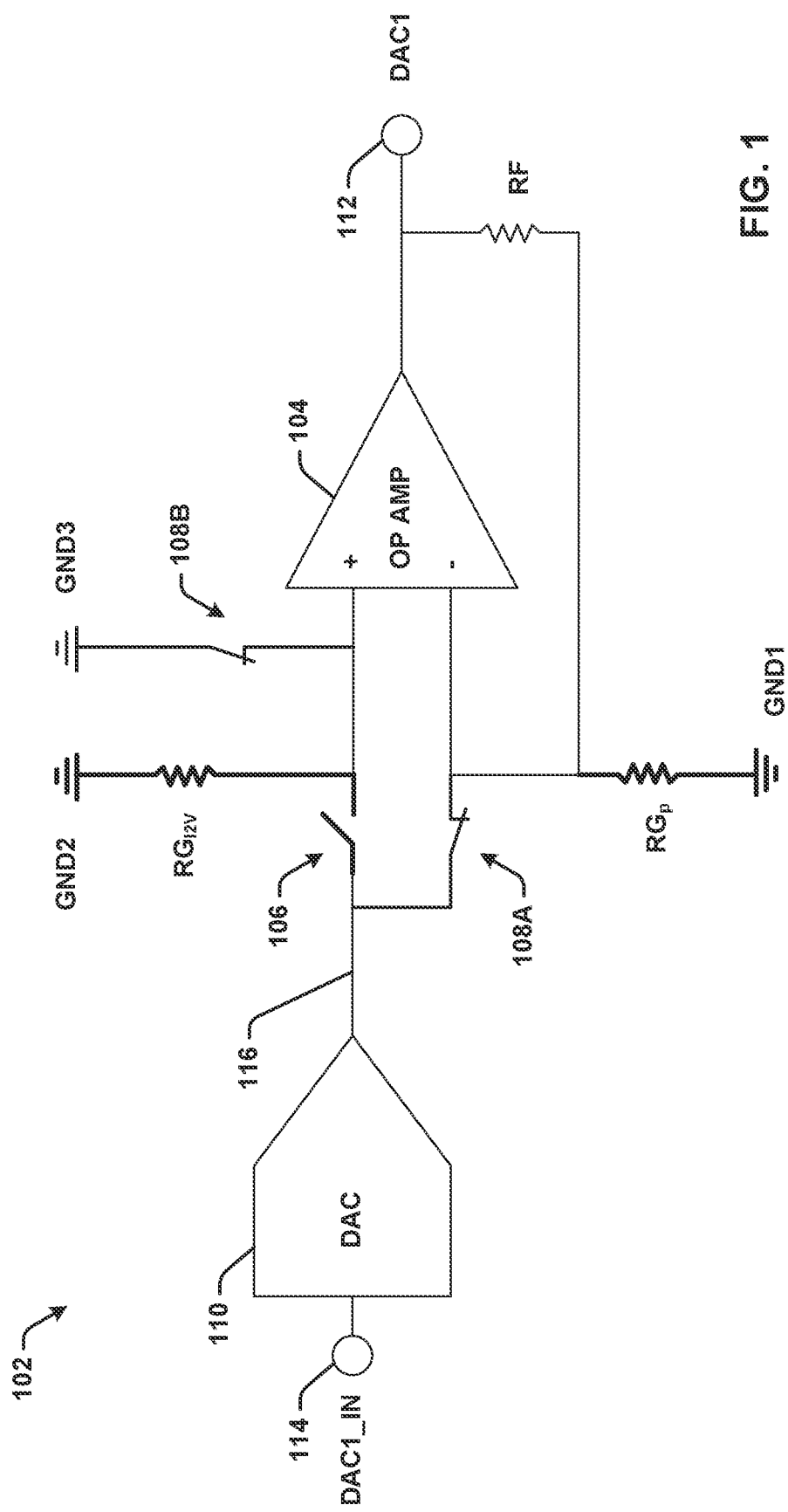
FIG. 1 is a circuit diagram for an example amplifier circuit capable of switching its output voltage domain between unipolar and bipolar.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

FIG. 1 is a circuit diagram for an example amplifier circuit 102 capable of switching between a unipolar output voltage domain and a bipolar output voltage domain. Circuit 102 can be embodied using any suitable circuit implementation, including but not limited to an on-chip component of a VLSI system, as a dedicated IC chip on which one or more instances of circuit 102 are packaged, or other such implementations. Amplifier circuit 102 comprises a digital-to-analog converter (DAC) 110 that receives a digital signal at its input 114 (labeled DAC1_IN) and generates a corresponding analog output signal on its output node 116. Although the present example depicts a DAC 110 as the signal source (e.g., a current source), other types of signal sources can be used to provide an input signal to the amplifier circuit without departing from the scope of this disclosure. The output signal of the DAC 110 is provided to an operational amplifier 104 or another type of amplifier via a configurable feedback circuit. The operational amplifier 104 amplifies the output signal of the DAC 110 and outputs the resulting amplified signal as the circuit's voltage output on output node 112 (labeled DAC1). Thus, amplifier circuit 102 outputs a voltage signal on its output 112 having an amplitude that is set based on the digital signal received at the input 114 of the DAC 110.

The output 116 of the DAC 110 is connected to a first side of a normally open switch 106 and to a first side of a normally closed switch 108A. The second side of the normally open switch 106 is connected to a first input (e.g., the non-inverting input) of the operational amplifier 104, and the second side of the normally closed switch 108A is connected to a second input (e.g., the inverting input) of the operational amplifier 104. The non-inverting input of the operational amplifier 104 is also connected to ground (GND2) via a resistor $RG_{12V}$, and has a second connection to ground (GND3) via a second normally closed switch 108B connected in parallel with the resistor $RG_{12V}$. The inverting node of the operational amplifier 104 is connected to ground (GND1) via a resistor $RG_p$, and is also connected to the output 112 of the operational amplifier 104 via a feedback resistor RF.

Amplifier circuit 102 is designed to operate in either of two voltage domain modes, which can be set using switches 106, 108A, and 108B of the operational amplifier's feedback circuit. The signal gain of the circuit 102 depends on the mode selected. Switches 106, 108A, and 108B are configured to operate in tandem, such that while the normally open switch 106 is open, the two normally closed switches 108A and 108B are closed (as depicted in FIG. 1), and while the normally open switch 106 is closed, the two normally closed switches 108A and 108B are open. Depending on the implementation of circuit 102, the states of the switches 106, 108A, and 108B can be set by controlling (e.g., setting or resetting) a voltage signal on a dedicated I/O pin of the chip on which the circuit 102 is packaged, by writing a value to a dedicated voltage mode selection register associated with the circuit 102, or using another means for toggling between the two output voltage domains.

FIG. 1 depicts the amplifier circuit 102 configured to operate in the first mode, whereby normally open switch 106 is open and the normally closed switches 108A and 108B are closed. In this first mode, the non-inverting input of the operational amplifier 104 is shorted to ground (GND3) via the second normally closed switch 108B, and the output 116 of the DAC 110 is connected to the inverting input, rather than the non-inverting input, of the operational amplifier 104. The output 112 of the operational amplifier 104 is fed back to the inverting input of the operational amplifier 104 via feedback resistor RF, and the inverting input is also connected to ground (GND1) via resistor $RG_p$.

Figure 2:
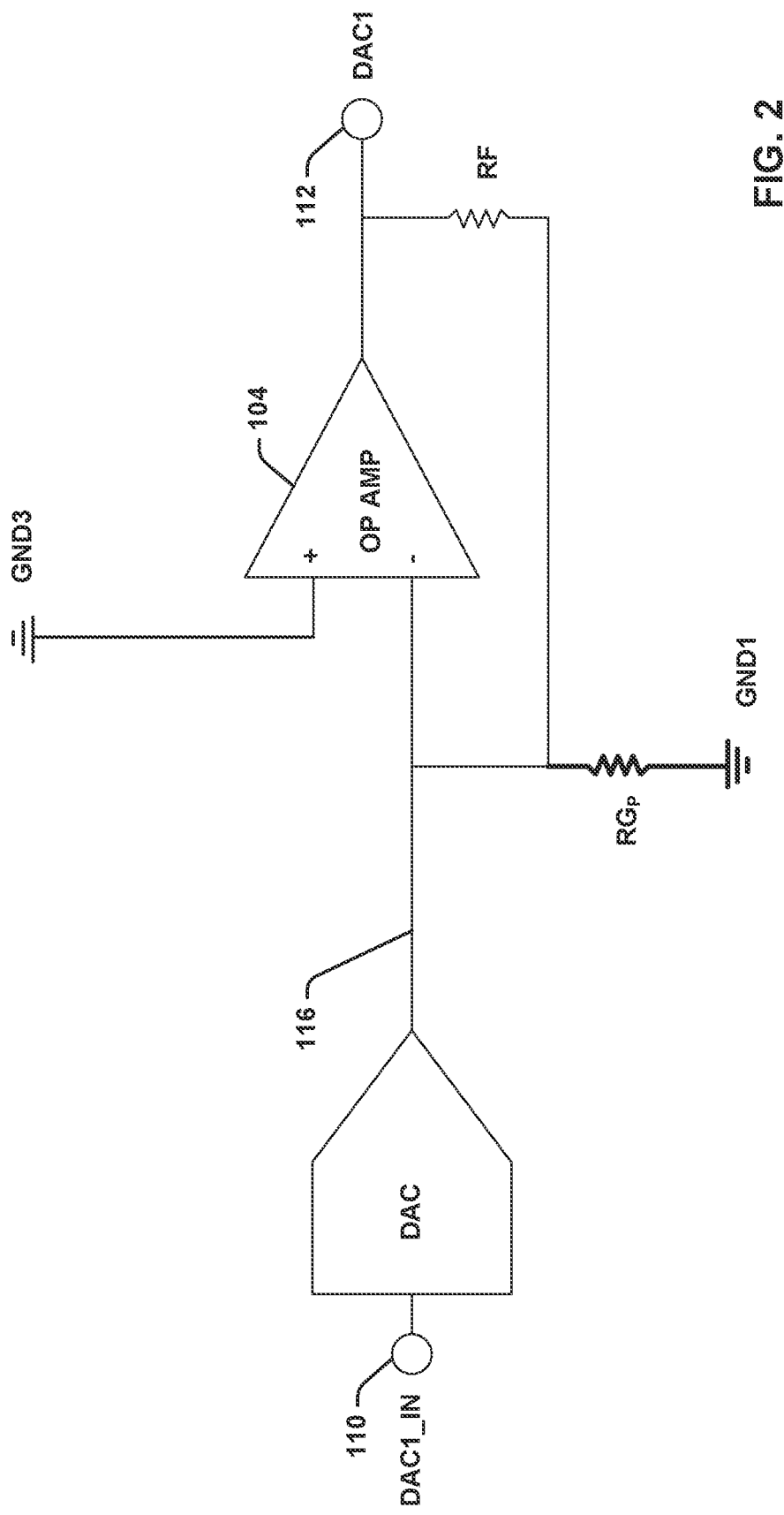
FIG. 2 is a simplified circuit diagram depicting an equivalent electrical circuit that results when the amplifier circuit is configured to operate in the first mode.

FIG. 2 is a simplified circuit diagram depicting the equivalent electrical circuit that results when the circuit 102 is configured to operate in the first mode. In this mode, the circuit 102 acts as an inverting amplifier circuit that amplifies the voltage signal of the DAC 110 with a signal gain $A_{SIGNAL}$ of:

$$A_{SIGNAL} = -RF \tag{1}$$

where RF is the resistance of resistor RF.

Thus, while configured to operate in the first operating mode, circuit 102 generates a negative output voltage.

Figure 3:
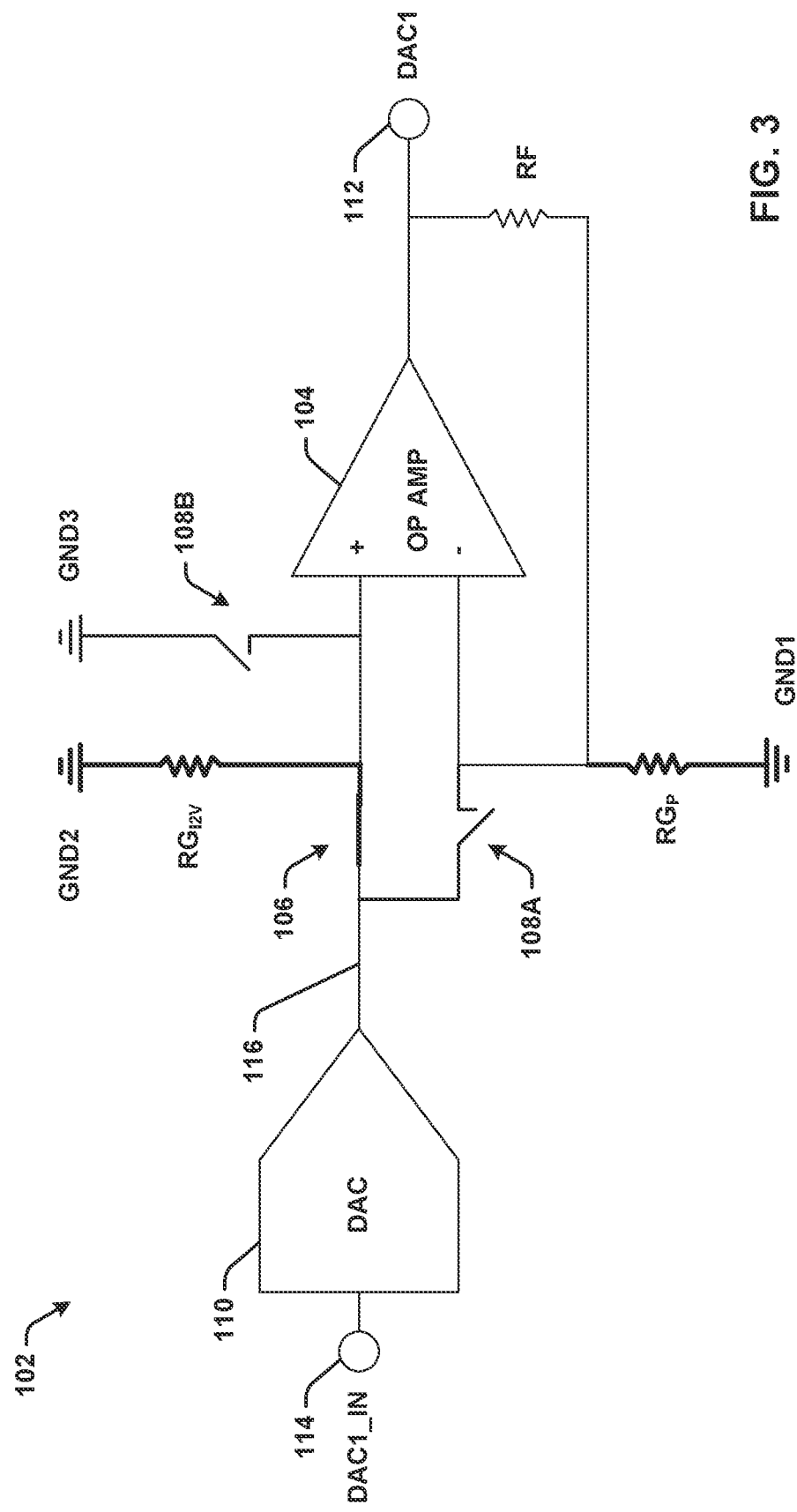
FIG. 3 is a circuit diagram for the example amplifier circuit configured to operate in a second mode.

FIG. 3 is a circuit diagram for the example amplifier circuit 102 in the second mode, whereby the normally open switch 106 is closed and the normally closed switches 108A and 108B are open. As noted above, the states of the switches 106, 108A, and 108B can be transitioned from their first mode states to their second mode states by switching a state of an input voltage on a dedicated mode control I/O pin of an IC chip on which the circuit 102 is implemented, by changing a value written to a mode control register associated with the circuit 102, or by another mode switching means. In this second mode, the output 116 of the DAC 110 is connected to the non-inverting input, rather than the inverting input, of the operational amplifier 104, and is also connected to ground (GND2) via resistor $RG_{12V}$. The output 112 of the operational amplifier 104 is fed back to the inverting input of the operational amplifier 104 via feedback resistor RF, and the inverting input is also connected to ground (GND1) via resistor $RG_p$.

Figure 4:
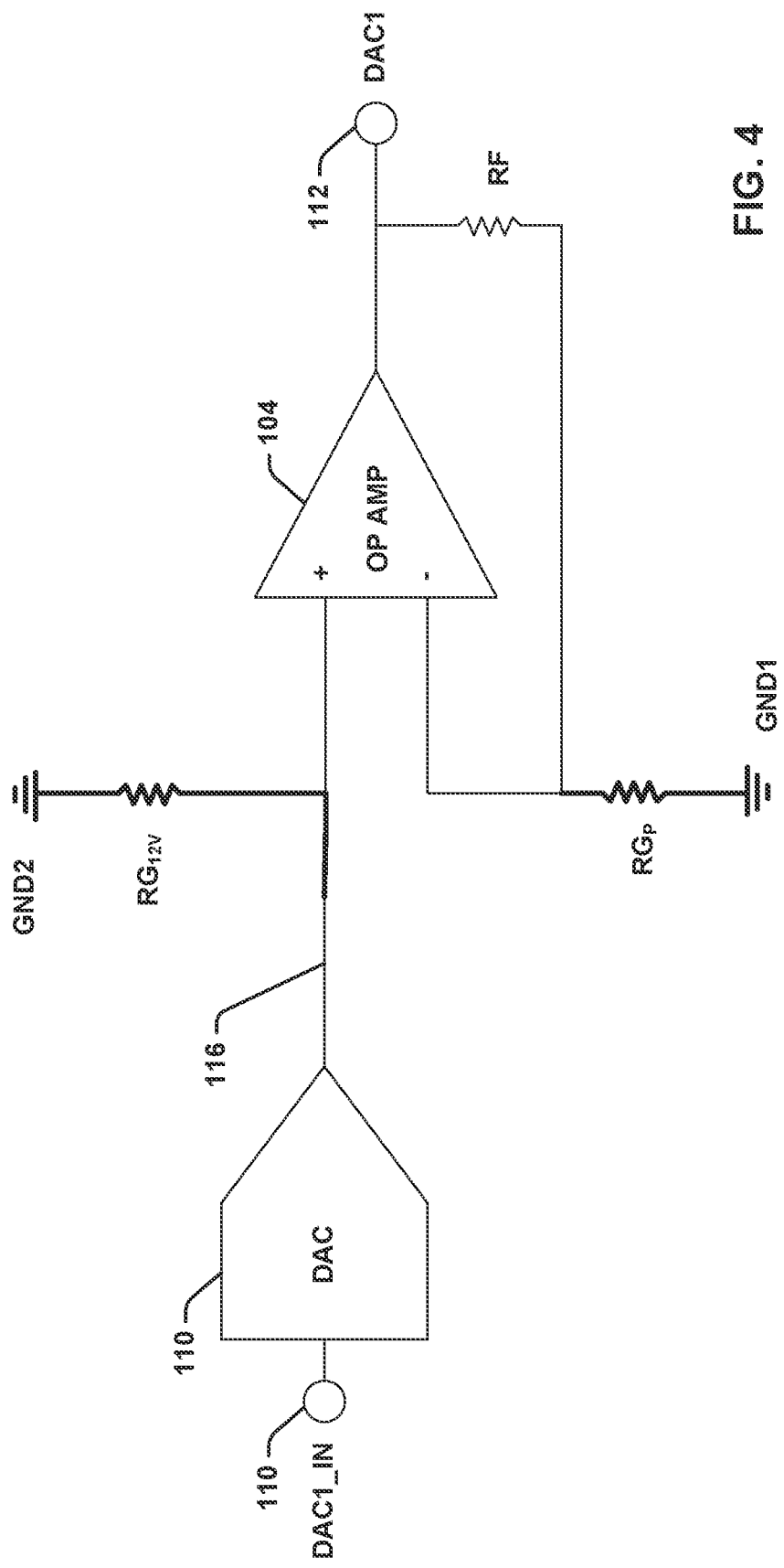
FIG. 4 is a simplified circuit diagram depicting the equivalent electrical circuit that results when the amplifier circuit is configured to operate in the second mode.

FIG. 4 is a simplified circuit diagram depicting the equivalent electrical circuit that results when the circuit 102 is configured to operate in the second mode. In this mode, the circuit acts as a non-inverting amplifier circuit that amplifies the output signal of the DAC 110 with a signal gain $A_{SIGNAL}$ of:

$$A_{SIGNAL} = \left(1 + \frac{RF}{RG_p}\right) \cdot RG_{12V} \tag{2}$$

where RF, $RG_p$, and $RG_{12V}$ are the resistances of resistors RF, $RG_p$, and $RG_{12V}$, respectively.

Thus, while configured to operate in the second operating mode, circuit 102 generates a positive output voltage given a positive signal from the DAC 110.

The values of resistors RF, $RG_p$, and $RG_{12V}$ can be set such that the absolute values of the signal gains $A_{SIGNAL}$ given by equations (1) and (2) in the respective two operating modes are equal or approximately equal. In an example, non-limiting configuration, resistor $RG_{12V}$ can have a resistance of 2.5 kiloohms (kΩ), resistor $RG_p$ can have a resistance of 2.78 kΩ, and feedback resistor RF can have a resistance of 25 kΩ. This yields an absolute value of $A_{SIGNAL}$ of approximately 25 in both the first (negative voltage) and the second (positive voltage) operating modes.

Figure 5:
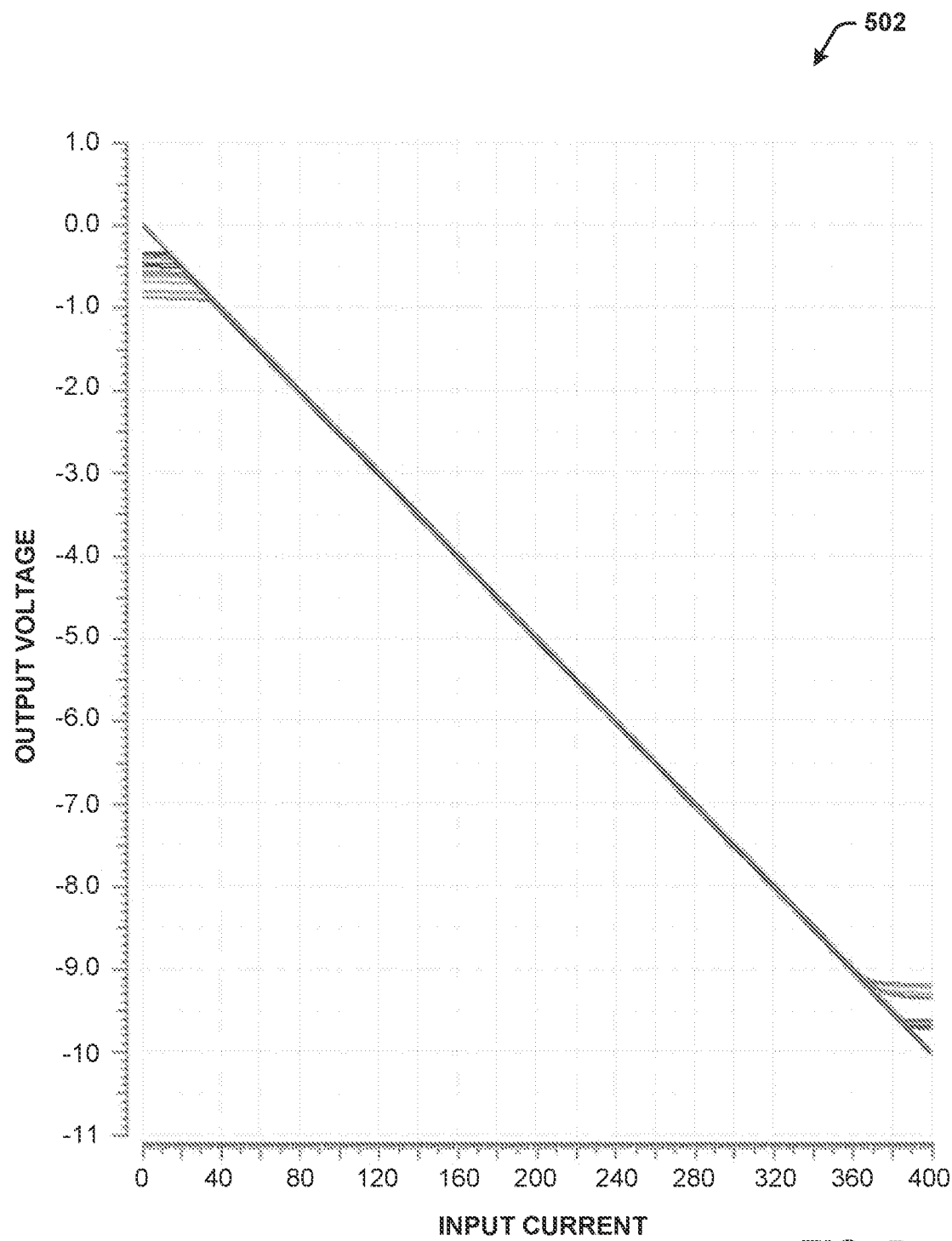
FIG. 5 is a graph plotting the output voltage as a function of input current for an embodiment of the amplifier circuit that operates in the range of 0V to −10V while operating in the first mode.
Figure 6:
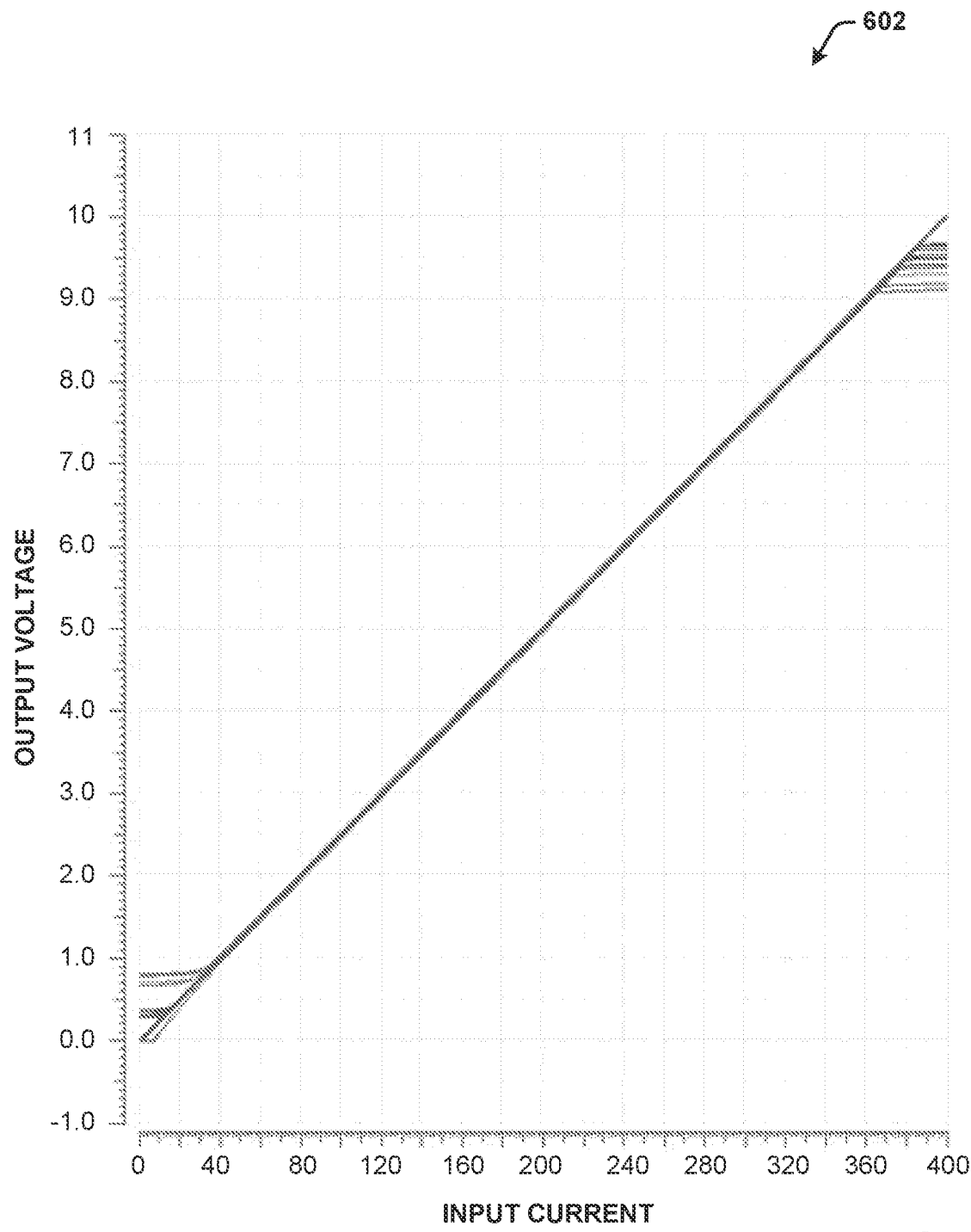
FIG. 6 is a graph plotting the output voltage as a function of input current for an embodiment of the amplifier circuit that operates in the range of 0V to +10V while operating in the second mode.

FIG. 5 is a graph 502 plotting the output voltage as a function of input current for an embodiment of circuit 102 that operates in the range of 0V to −10V while operating in the first mode (as shown in FIG. 1). FIG. 6 is a graph 602 plotting the output voltage as a function of input current for an embodiment of circuit 102 that operates in the range of 0V to +10V while operating in the second mode (as shown in FIG. 3). It is to be appreciated that these circuit responses are only intended to be exemplary, and that the slopes and ranges of the output voltage responses for the circuit 102 while operating in the respective two modes can be changed via selection of the resistor sizes used in the amplifier feedback circuit.

The operational amplifier's configurable feedback arrangement allows the circuit 102 to supply output voltage in either a unipolar or bipolar domain, thereby allowing the circuit 102 to serve as a flexible voltage supply that can be used in either unipolar or bipolar applications. The output voltage domain can be easily set via user interaction or by a signal provided by a separate system (e.g., an external application, another sub-system of the SoC on which the circuit 102 operates, or another control source), allowing a single circuit design to be used to supply voltage to either unipolar or bipolar applications or products.

In some embodiments, switches 106, 108A, and 108B can be static switches. This can ensure that the circuit's output voltage is generated with high accuracy, since the static switches 106, 108A, and 108B do not impact the accuracy of the voltage output. Inclusion of static switches 106, 108A, and 108B in the operational amplifier's feedback circuit does not appreciably increase the power consumption of the circuit 102 since the switches 106, 108A, and 108B consume little or no additional power.

Also, the design of circuit 102 is such that the noise gain $A_{NOISE}$ of the circuit 102 is the same or substantially the same for both operating modes, and is characterized by:

$$A_{NOISE} = 1 + \frac{RF}{RGp} \quad (3)$$

Since the noise gain is the same in both operating modes, a single noise compensation circuit can be used to compensate for the noise gain and stabilize the circuit 102 (e.g., to prevent overshoot or ringing) regardless of the operating mode of the circuit 102, even if the operating mode will be switched during operation. That is, rather than requiring two different noise compensation circuits to compensate for noise while in operating in the respective two operating modes, the same noise compensation circuit can be used to stabilize the amplifier circuit 102 in both operating modes.

In some implementations, multiple instances of circuit 102 can be provided on a single IC chip, which can be designed to allow the operating mode of each instance of the circuit 102 to be set independently of the others. In such embodiments, each instance of the circuit 102 can have an associated mode register that controls the states of that instance's mode switches 106, 108A, and 108B, and the operating modes of the respective instances of the circuit 102 can be set by writing the appropriate values to these registers. Alternatively, the operating modes of the respective instances of the circuit 102 can be set using dedicated mode control input pins on the chip. Other implementations may provide multiple instances of the circuit 102 on a single chip, where the instances are organized into groups that each comprise two or more instances of the circuit 102, and the operating mode of each group of circuits 102 is collectively controlled by a single register or input pin. This can allow multiple instances of the amplifier circuit 102 to be set to operate in the same mode using a single control, while also reducing the amount of chip resources required to control the operating modes, as compared to individually controlling the mode for each instance.

Figure 7:
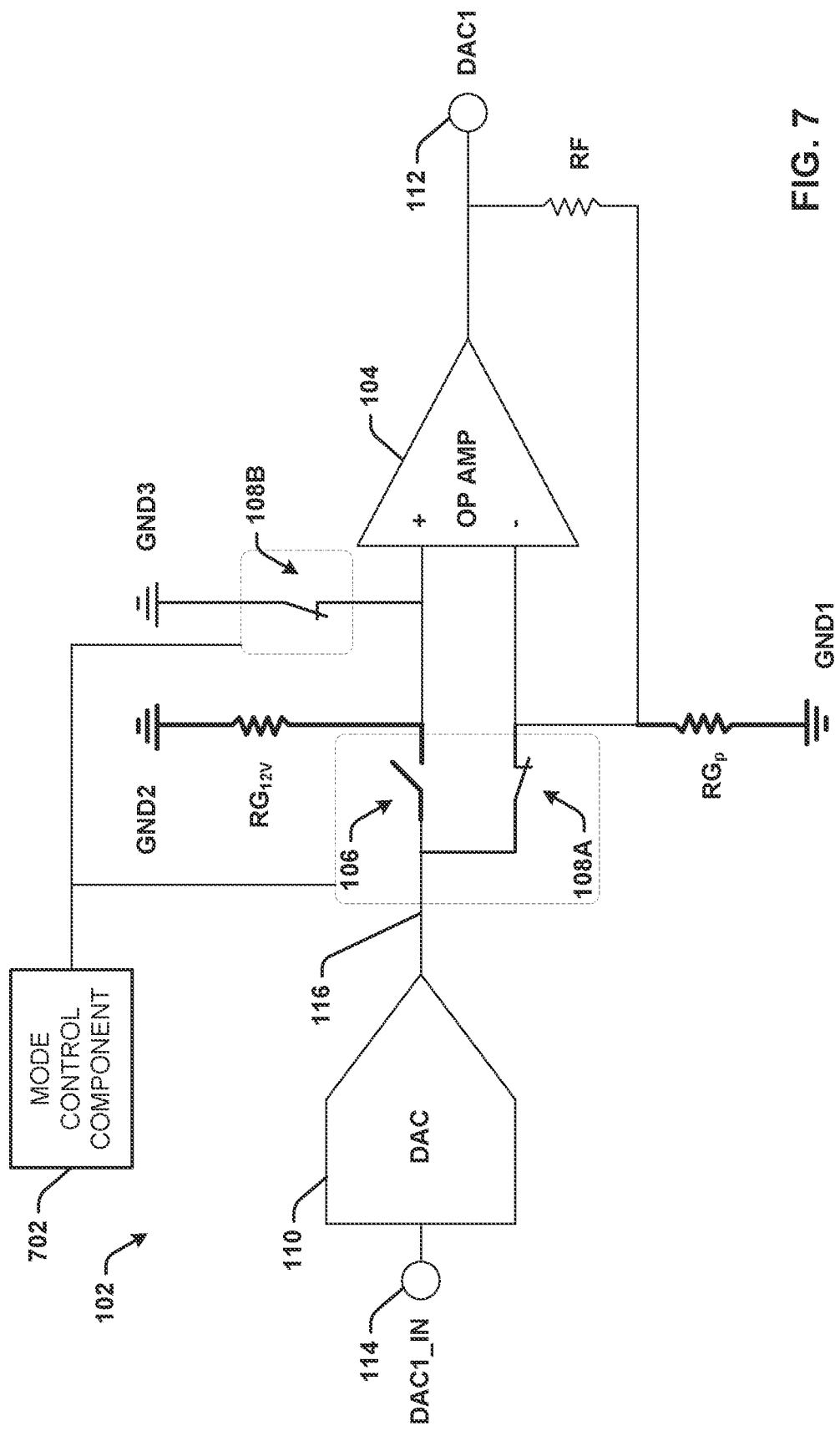
FIG. 7 is an example circuit diagram in which the mode of the amplifier circuit is controlled by a mode control component.

In some embodiments, an additional component can be added to automatically determine a suitable operating mode for the amplifier circuit 102 based on the polarity of a supply voltage provided to the circuit 102, and to set the states of switches 106, 108A, and 108B based on this polarity. This additional component can set the circuit 102 to operate in the second mode depicted in FIG. 3 if a positive supply voltage is detected so that the circuit 102 outputs a positive voltage, and set the circuit 102 to operate in the first mode depicted in FIG. 1 if a negative supply voltage is detected so that the circuit 102 outputs a negative voltage. FIG. 7 is an example circuit diagram in which the mode of the amplifier circuit 102 is controlled by a mode control component 702. Mode control component 702 can be any suitable circuit or system capable of detecting a supply voltage provided to the amplifier circuit 102 and to control the states of the switches 106, 108A, and 108B based on a determination of whether the supply voltage is positive or negative. In other embodiments, the mode control component 702 can be configured to detect or measure other criteria to be used as the basis for setting the operating mode of the circuit 102 via control of switches 106, 108A, and 108B.

Embodiments of amplifier circuit 102 can offer design flexibility by operating as either a unipolar voltage supply or a bipolar voltage supply, allowing the same amplifier circuit design to be used in different contexts without being constrained by the domain of the power supply. The amplifier circuit's output voltage domain can be easily set via user interaction or other appropriate signaling, and the output voltage domain can be changed without the need to use different noise compensation circuits for the two operating modes. Since the output voltage domain is controlled using static switches that do not consume power or impact accuracy, the amplifier circuit 102 preserves high output voltage accuracy with no impact on the circuit's overall power consumption.

Embodiments of the amplifier circuit 102 can be implemented in substantially any type of device, system, or product requiring a high-accuracy supply or bias voltage. For example, the circuit 102 can be used in a telecommunication system to provide a bias voltage for a radio frequency amplifier. This application of circuit 102 is not intended to be limiting, however, and other types of devices, systems, and products that employ circuit 102 to provide a supply or bias voltage or signal are within the scope of one or more embodiments.

Figure 8:
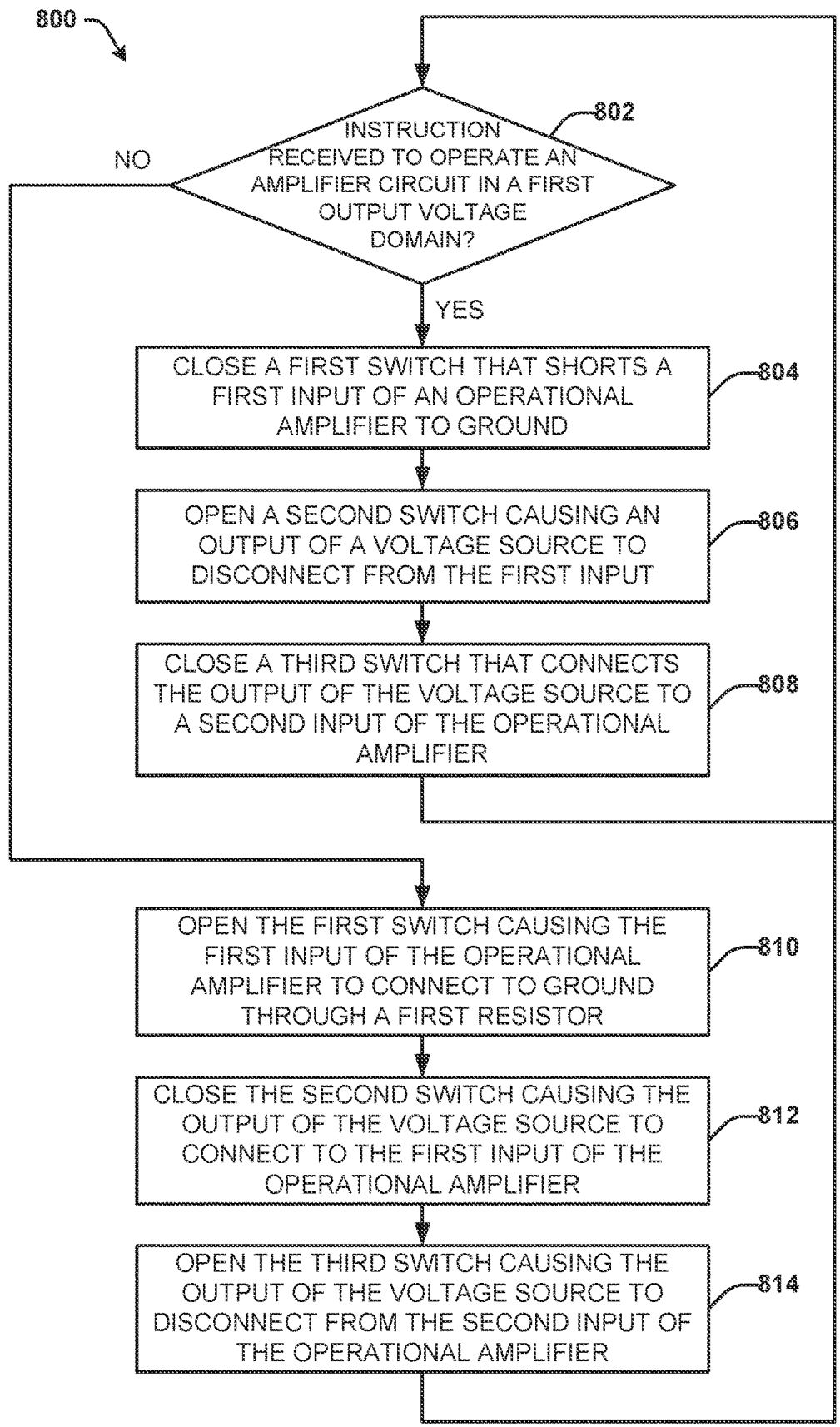
FIG. 8 illustrates a flow diagram of an example, non-limiting embodiment of a method for switching an output voltage domain of an amplifier circuit.

FIG. 8 illustrates a methodology in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Referring to FIG. 8, a flow diagram of an example, non-limiting embodiment for switching an output voltage domain of an amplifier circuit is shown. Method 800 can begin at step 802, where a determination is made as to whether an instruction is received to operate an amplifier circuit in a first output voltage domain. The first output voltage domain can cause the amplifier circuit to output a voltage in a range from −10V to 0V. The amplifier circuit can comprise, in part, an operational amplifier having a first resistor connected between its first input (e.g., the non-inverting input) and ground, a second resistor connected between its second input (e.g., the inverting input) and ground, and a feedback resistor connected between its output and its second input. If the instruction to operate the amplifier circuit in the first output voltage domain is received (YES at step 802), the methodology proceeds to step 804, where a first switch is closed, causing the first input of the operational amplifier to be shorted to ground. The first switch can be installed in parallel with the first resistor such that closing the first switch bypasses the first resistor. At 806, a second switch is opened causing an output of a signal source (e.g., current source such as a DAC) to disconnect from the first input of the operational amplifier. At 808, a third switch is closed, causing the output of the signal source to connect to the second input of the operational amplifier. The methodology then returns to step 802 and the methodology waits for the instruction to operate the amplifier circuit in the first output voltage domain to be removed, indicating that the amplifier circuit is to be operated in a second output voltage domain, whereby the amplifier circuit outputs a voltage in a range from −0V to +10V.

If the instruction to operate in the first output voltage domain is removed (NO at step 802), the methodology proceeds to step 810, where the first switch is opened, causing the first input of the operational amplifier to connect to ground through the first resistor. At 812, the second switch is closed, causing the output of the signal source to connect to the first input of the operational amplifier. At 814, the third switch is opened, causing the output of the signal source to disconnect from the second input of the operational amplifier. The methodology then returns to step 802 and waits for the instruction to operate in the first output voltage domain to be received.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An amplifier circuit, comprising:
an operational amplifier;
a first switch that connects a first input of the operational amplifier to ground;
a first resistor in parallel with the first switch;
a second switch that connects an output of an input signal source to the first input of the operational amplifier;
a third switch that connects the output of the input signal source to a second input of the operational amplifier;
a second resistor connected between the second input of the operational amplifier and ground;
a feedback resistor connected between an output of the operational amplifier and the second input of the operational amplifier,
wherein
in response to an instruction to operate in a first mode, the first switch and the third switch close and the second switch opens, and
in response to an instruction to operate in a second mode, the first switch and the third switch open and the second switch closes; and
a mode control component configured to selectively generate the instruction to operate in the first mode or the instruction to operate in the second mode in response to detecting a condition that dictates operation of the amplifier circuit in the first mode or in the second mode.

2. The amplifier circuit of claim 1, wherein the first input is a non-inverting input of the operational amplifier and the second input is an inverting input of the operational amplifier.

3. The amplifier circuit of claim 1, wherein
a negative output voltage is produced on the output of the operational amplifier while operating in the first mode, and
a positive output voltage is produced on the output of the operational amplifier while operating in the second mode.

4. The amplifier circuit of claim 1, wherein the input signal source is a digital-to-analog converter.

5. The amplifier circuit of claim 1, wherein a noise gain of the amplifier circuit while operating in the first mode is equal to a noise gain of the amplifier circuit while operating in the second mode.

6. The amplifier circuit of claim 1, wherein
the instruction to operate in the first mode comprises a first value written to a register associated with the amplifier circuit, and
the instruction to operate in the second mode comprises a second value written to a register associated with the amplifier circuit.

7. The amplifier circuit of claim 1, wherein at least one of the instruction to operate in the first mode or the instruction to operate in the second mode comprises a voltage signal.

8. The amplifier circuit of claim 1, wherein the condition is a polarity of a supply voltage of the amplifier circuit.

9. The amplifier circuit of claim 1, wherein a signal gain of the amplifier circuit while operating in the first mode is given by $$A_{SIGNAL} = -RF$$

where $A_{SIGNAL}$ is the signal gain and RF is a resistance of the feedback resistor.

10. The amplifier circuit of claim 9, wherein a signal gain of the amplifier circuit while operating in the second mode is given by $$A_{SIGNAL} = \left(1 + \frac{RF}{RG_v}\right) \cdot RG_{l2V}$$

where $RG_p$ is a resistance of the second resistor and $RG_{12V}$ is a resistance of the first resistor.

11. The amplifier circuit of claim 10, wherein resistances of the first resistor, the second resistor, and the feedback resistor cause the signal gain of the amplifier circuit while operating in the first mode to be approximately equal to the signal gain of the amplifier circuit while operating in the second mode.

12. A telecommunications device comprising the amplifier circuit of claim 1.

13. An amplifier circuit, comprising:
   an operational amplifier having a first input connected to ground via a first resistor, a second input connected to ground via a second resistor, and an output connected to the second input via a feedback resistor;
   a first switch configured to short the first input to ground while closed;
   a second switch configured to connect an output of an input signal source to the first input while closed;
   a third switch configured to connect the output of the input signal source to the second input while closed,
   wherein
      in response to an instruction to operate in a first voltage domain, the first switch and the third switch close and the second switch opens, and
      in response to an instruction to operate in a second voltage domain, the first switch and the third switch open and the second switch closes; and
   a mode control component configured to
      generate the instruction to operate in the first voltage domain in response to detecting a condition that dictates operation of the amplifier circuit in the first voltage domain, and
      generate the instruction to operate in the second voltage domain in response to detecting a condition that dictates operation of the amplifier circuit in the second voltage domain.

14. The amplifier circuit of claim 13, wherein the first input is a non-inverting input of the operational amplifier and the second input is an inverting input of the operational amplifier.

15. The amplifier circuit of claim 13, wherein
   a negative output voltage is produced on the output of the operational amplifier while operating in the first voltage domain, and
   a positive output voltage is produced on the output of the operational amplifier while operating in the second voltage domain.

16. The amplifier circuit of claim 13, wherein the input signal source is a digital-to-analog converter.

17. The amplifier circuit of claim 13, wherein a noise gain of the amplifier circuit while operating in the first voltage domain is equal to a noise gain of the amplifier circuit while operating in the second voltage domain.

18. A method for switching an output voltage domain of an amplifier circuit, comprising:
   in response to detecting a condition that dictates operation of the amplifier circuit in a first mode:
      closing a first switch that shorts a first input of an operational amplifier to ground;
      opening a second switch causing an output of an input signal source to disconnect from the first input; and
      closing a third switch that connects the output of the input signal source to a second input of the operational amplifier; and
   in response to detecting a condition that dictates operation of the amplifier circuit in a second mode:
      opening the first switch causing the first input to connect to ground through a first resistor;
      closing the second switch causing the output of the input signal source to connect to the first input of the operational amplifier; and
      opening the third switch causing the output of the input signal source to disconnect from the second input of the operational amplifier,
   wherein
   the second input of the operational amplifier is connected to ground through a second resistor, and
   a feedback resistor is connected between an output of the operational amplifier and the second input of the operational amplifier.

19. The method of claim 18, wherein the first input of the operational amplifier is a non-inverting input and the second input of the operational amplifier is an inverting input.

20. An amplifier circuit, comprising:
   an operational amplifier and an associated feedback circuit,
   wherein
   the feedback circuit comprises switches,
   detection of a first condition that dictates operation of the amplifier circuit in a first mode causes the switches to be set to a first set of states that configure the feedback circuit to cause the amplifier circuit to act as an inverting amplifier circuit, and
   detection of a second condition that dictates operation of the amplifier circuit in a second mode causes the switches to be set to a second set of states that configure the feedback circuit to cause the amplifier circuit to act as a non-inverting amplifier circuit.

21. The amplifier circuit of claim 20, wherein setting the switches to the first set of states causes:
   a non-inverting input of the operational amplifier to be connected to ground,
   an output of a signal source to be connected to ground via a first resistor and to an inverting input of the operational amplifier, and
   an output of the operational amplifier to be connected to the inverting input via a feedback resistor.

22. The amplifier circuit of claim 20, wherein setting the switches to the second set of states causes:
   an output of the signal source to be connected to ground via a second resistor and to the non-inverting input, and
   the output of the operational amplifier to be connected to the inverting input via the feedback resistor.

23. The amplifier circuit of claim 20, wherein the first condition and the second condition are polarities of a supply voltage of the amplifier circuit.

* * * * *